United States Patent
Oomachi et al.

(10) Patent No.: US 9,006,697 B2
(45) Date of Patent: Apr. 14, 2015

(54) RESISTANCE CHANGE ELEMENT AND NONVOLATILE MEMORY DEVICE

(71) Applicant: Kabushiki Kaisha Toshiba, Minato-ku, Tokyo (JP)

(72) Inventors: Noritake Oomachi, Tokyo (JP); Junichi Wada, Mie-ken (JP); Kouji Matsuo, Aichi-ken (JP); Tomotaka Ariga, Mie-ken (JP); Yoshio Ozawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 29 days.

(21) Appl. No.: 13/781,713

(22) Filed: Feb. 28, 2013

(65) Prior Publication Data

US 2013/0248808 A1    Sep. 26, 2013

(30) Foreign Application Priority Data

Mar. 23, 2012  (JP) ................................. 2012-068472

(51) Int. Cl.
*H01L 47/00* (2006.01)
*H01L 45/00* (2006.01)
*H01L 27/24* (2006.01)

(52) U.S. Cl.
CPC .............. *H01L 45/146* (2013.01); *H01L 45/04* (2013.01); *H01L 45/08* (2013.01); *H01L 45/1233* (2013.01); *H01L 45/1625* (2013.01); *H01L 27/2409* (2013.01); *H01L 27/2481* (2013.01)

(58) Field of Classification Search
USPC ......................................................... 257/1, 4
See application file for complete search history.

(56) References Cited

U.S. PATENT DOCUMENTS

| | | |
|---|---|---|
| 8,018,761 B2 | 9/2011 | Muraoka et al. |
| 2004/0114444 A1 | 6/2004 | Matsuoka |
| 2009/0097300 A1 | 4/2009 | Ishihara et al. |
| 2009/0283736 A1 | 11/2009 | Kanzawa et al. |
| 2010/0008127 A1 | 1/2010 | Muraoka et al. |
| 2010/0232204 A1 | 9/2010 | Muraoka et al. |
| 2011/0002154 A1 | 1/2011 | Mitani et al. |

FOREIGN PATENT DOCUMENTS

| | | |
|---|---|---|
| JP | 2007-288016 A | 11/2007 |
| JP | 2008-235427 A | 10/2008 |
| WO | WO 2008/081742 A1 | 7/2008 |

*Primary Examiner* — Marvin Payen
(74) *Attorney, Agent, or Firm* — Holtz, Holtz, Goodman & Chick PC

(57) ABSTRACT

A resistance change element includes a first conductive layer, a second conductive layer, and a memory layer. The memory layer is provided between the first conductive layer and the second conductive layer. The memory layer is capable of reversibly transitioning between a first state and a second state due to at least one of a voltage and a current supplied via the first conductive layer and the second conductive layer. A resistance of the second state is higher than a resistance of the first state. The memory layer includes niobium oxide. One of a (100) plane, a (010) plane, and a (110) plane of the memory layer is oriented in a stacking direction from the first conductive layer toward the second conductive layer.

19 Claims, 6 Drawing Sheets

| | x | C T Y | CP | γ | Ev |
|---|---|---|---|---|---|
| SP01 | 2.5 | CR | (010) | 0.054 | LR |
| SP02 | 2.5 | CR | (010) | 0.055 | LR |
| SP03 | 2.5 | CR | (100) | 0.057 | LR |
| SP04 | 2.4 | CR | (110) | 0.059 | LR |
| SP05 | 2.4 | CR | (110) | 0.061 | LR |
| SP06 | 2.4 | CR | (010) | 0.062 | LR |
| SP07 | 2.4 | CR | (001) | 0.063 | HR |
| SP08 | 2.4 | CR | (111) | 0.079 | HR |
| SP09 | 1.8 | NC | — | 0.086 | HR |
| SP10 | 1.8 | NC | — | 0.092 | HR |
| SP11 | 1.2 | NC | — | 0.095 | HR |
| SP12 | 0.8 | NC | — | 0.112 | HR |

| | x | CTY | CP | γ | Ev |
|---|---|---|---|---|---|
| SP01 | 2.5 | CR | (010) | 0.054 | LR |
| SP02 | 2.5 | CR | (010) | 0.055 | LR |
| SP03 | 2.5 | CR | (100) | 0.057 | LR |
| SP04 | 2.4 | CR | (110) | 0.059 | LR |
| SP05 | 2.4 | CR | (110) | 0.061 | LR |
| SP06 | 2.4 | CR | (010) | 0.062 | LR |
| SP07 | 2.4 | CR | (001) | 0.063 | HR |
| SP08 | 2.4 | CR | (111) | 0.079 | HR |
| SP09 | 1.8 | NC | — | 0.086 | HR |
| SP10 | 1.8 | NC | — | 0.092 | HR |
| SP11 | 1.2 | NC | — | 0.095 | HR |
| SP12 | 0.8 | NC | — | 0.112 | HR |

US 9,006,697 B2

RESISTANCE CHANGE ELEMENT AND NONVOLATILE MEMORY DEVICE

CROSS-REFERENCE TO RELATED APPLICATIONS

This application is based upon and claims the benefit of priority from the prior Japanese Patent Application No. 2012-068472, filed on Mar. 23, 2012; the entire contents of which are incorporated herein by reference.

FIELD

Embodiments described herein relate generally to a resistance change element and a nonvolatile memory device.

BACKGROUND

There is a nonvolatile memory device using a resistance change element having a low resistance state and a high resistance state. In the manufacturing of the resistance change element and the nonvolatile memory device, forming processing is performed to set them to a usage state.

DETAILED DESCRIPTION

Figures 1, 2:
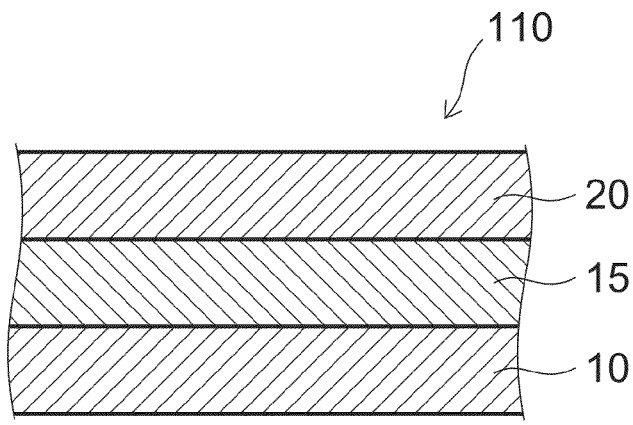
FIG. 1 is one example of a schematic cross-sectional view illustrating the configuration of a resistance change element according to a first embodiment.
FIG. 2 is a table illustrating characteristics of the resistance change element according to the first embodiment.

According to one embodiment, a resistance change element includes a first conductive layer, a second conductive layer, and a memory layer. The memory layer is provided between the first conductive layer and the second conductive layer. The memory layer is capable of reversibly transitioning between a first state and a second state due to at least one of a voltage and a current supplied via the first conductive layer and the second conductive layer. A resistance of the second state is higher than a resistance of the first state. The memory layer includes niobium oxide. One of a (100) plane, a (010) plane, and a (110) plane of the memory layer is oriented in a stacking direction from the first conductive layer toward the second conductive layer.

According to another embodiment, a resistance change element includes a first conductive layer, a second conductive layer, and a memory layer. The memory layer is provided between the first conductive layer and the second conductive layer. The memory layer is capable of reversibly transitioning between a first state and a second state due to at least one of a voltage and a current supplied via the first conductive layer and the second conductive layer. A resistance of the second state is higher than a resistance of the first state. The memory layer includes niobium oxide. A ratio of an intensity at a binding energy of 205 eV to an intensity at a binding energy of 207.5 eV of X-ray photoelectron spectroscopy of Nb included in the memory layer is 0.062 or less.

According to another embodiment, a nonvolatile memory device includes a resistance change element, a first interconnection, and a second interconnection. The resistance change element includes a first conductive layer, a second conductive layer, and a memory layer. The memory layer is provided between the first conductive layer and the second conductive layer. The memory layer is capable of reversibly transitioning between a first state and a second state due to at least one of a voltage and a current supplied via the first conductive layer and the second conductive layer. A resistance of the second state is higher than a resistance of the first state. The memory layer includes niobium oxide. One of a (100) plane, a (010) plane, and a (110) plane of the memory layer is oriented in a stacking direction from the first conductive layer toward the second conductive layer. The first interconnection is electrically connected to the first conductive layer. The second interconnection is electrically connected to the second conductive layer.

Various embodiments will be described hereinafter with reference to the accompanying drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

First Embodiment

FIG. 1 is one example of a schematic cross-sectional view illustrating the configuration of a resistance change element according to a first embodiment.

As shown in FIG. 1, a resistance change element 110 according to the embodiment includes a first conductive layer 10, a second conductive layer 20, and a memory layer 15. The memory layer 15 is provided between the first conductive layer 10 and the second conductive layer 20.

A voltage and a current are supplied to the memory layer 15 via the first conductive layer 10 and the second conductive layer 20. The memory layer 15 reversibly transitions between a first state with a low resistance (a low resistance state) and a second state with a higher resistance than the first state (a high resistance state) due to at least one of the voltage and the current supplied.

For the first conductive layer 10 and the second conductive layer 20, for example, at least one of Pt, Au, Ag, Ru, RuN, Ir, Co, Ni, Ti, TiN, TaN, W, and Al is used. Sputtering, for example, is used for the formation of the first conductive layer 10 and the second conductive layer 20.

Niobium oxide is used for the memory layer 15. That is, for example, $NbO_x$ (0<x≤2.5) is used as the memory layer 15. The PVD (physical vapor deposition) method, for example, is used for the formation of the memory layer 15. The PVD method includes, for example, a deposition method based on reactive sputtering using an Nb target and $O_2$ gas and a deposition method based on cosputtering using an $Nb_2O_5$ target and an Nb target.

When the memory layer 15 is in the high resistance state, a first voltage is applied between the first conductive layer 10 and the second conductive layer 20, for example. Thereby, the memory layer 15 changes from the high resistance state to the low resistance state. The operation is referred to as a set operation. The set operation is, for example, the write operation.

In an operation that returns the low resistance state to the high resistance state, for example, a second voltage with a polarity opposite to that of the set operation is applied between the first conductive layer 10 and the second conductive layer 20. Thereby, the memory layer 15 changes from the low resistance state to the high resistance state. The operation is referred to as a reset operation. The reset operation is, for example, the erase operation.

The reading of written information is performed by, for example, applying a voltage pulse to the memory layer 15 and detecting the resistance value of the memory layer 15. At this time, the magnitude of the voltage pulse is set to such a small value that the resistance of the memory layer 15 does not change.

In general, the resistance of the resistance change element 110 is high immediately after the resistance change element 110 is formed. Thus, forming processing is performed in which the resistance of the memory layer 15 is reduced to change the memory layer 15 to a state where the switching operation can be performed. The forming processing is performed by applying a voltage to the memory layer. The amplitude of the voltage pulse used for the forming processing is larger than the amplitude of the voltage pulse used for the switching operation. The pulse width of the voltage pulse used for the forming processing is longer than the pulse width of the voltage pulse used for the switching operation. Further, in the forming processing, the voltage pulse may be applied multiple times. Therefore, the forming processing complicates the manufacturing of the resistance change element 110. The embodiment provides, for example, a resistance change element that eliminates the need for the forming processing. Thereby, the manufacturing of the resistance change element 110 can be made easier.

Experimental results in regard to the resistance change element 110 will now be described.

In this experiment, various samples were fabricated by stacking the first conductive layer 10, the memory layer 15, and the second conductive layer 20 in this order on a substrate.

A silicon substrate was used as the substrate. Ruthenium was used for the first conductive layer 10 and the second conductive layer 20. The size of the first conductive layer 10 and the second conductive layer 20 was approximately 20 mm×20 mm, and the thickness of the first conductive layer 10 and the second conductive layer 20 was set to approximately 100 nm. Sputtering was used for the formation of the first conductive layer 10 and the second conductive layer 20.

Pieces of $NbO_x$ formed by the PVD method under various conditions were used as the memory layer 15 to fabricate the samples.

In the fabrication of the samples, the deposition power is not less than 50 W and not more than 2000 W, the substrate temperature is not less than room temperature and not more than 500° C., the pressure is not less than 0.05 Pa and not more than 2 Pa, and the oxygen partial pressure is not less than 0% and not more than 90%. The film thickness is not less than 1 nm and not more than 30 nm. The deposition power is, for example, an amount given by the product of the voltage applied to the target and the current flowing through the target.

In the following, a first sample SP01 to a twelfth sample SP12 are described. In the samples, the composition ratio x of oxygen in $NbO_x$ of the memory layer 15 was changed by changing the oxygen partial pressure. The composition ratios x of oxygen in the samples were analyzed with an ICP mass spectrometer (ICP-MS).

FIG. 2 is a table illustrating characteristics of the resistance change element according to the first embodiment.

As shown in FIG. 2, the composition ratio x of oxygen is 2.5 in the first sample SP01 to the third sample SP3, and the composition ratio x is 2.4 in the fourth sample SP04 to the eighth sample SP08. The composition ratio x is 1.8 in the ninth sample SP09 and the tenth sample SP10. The composition ratio x is 1.2 in the eleventh sample SP11, and the composition ratio x is 0.8 in the twelfth sample SP12.

For the samples, using the thin film X-ray diffraction (XRD) method, it was investigated whether the $NbO_x$ of the memory layer 15 was a crystal or not. In the case where it was a crystal, the direction of the crystal plane having the maximum intensity was found.

Figure 3:
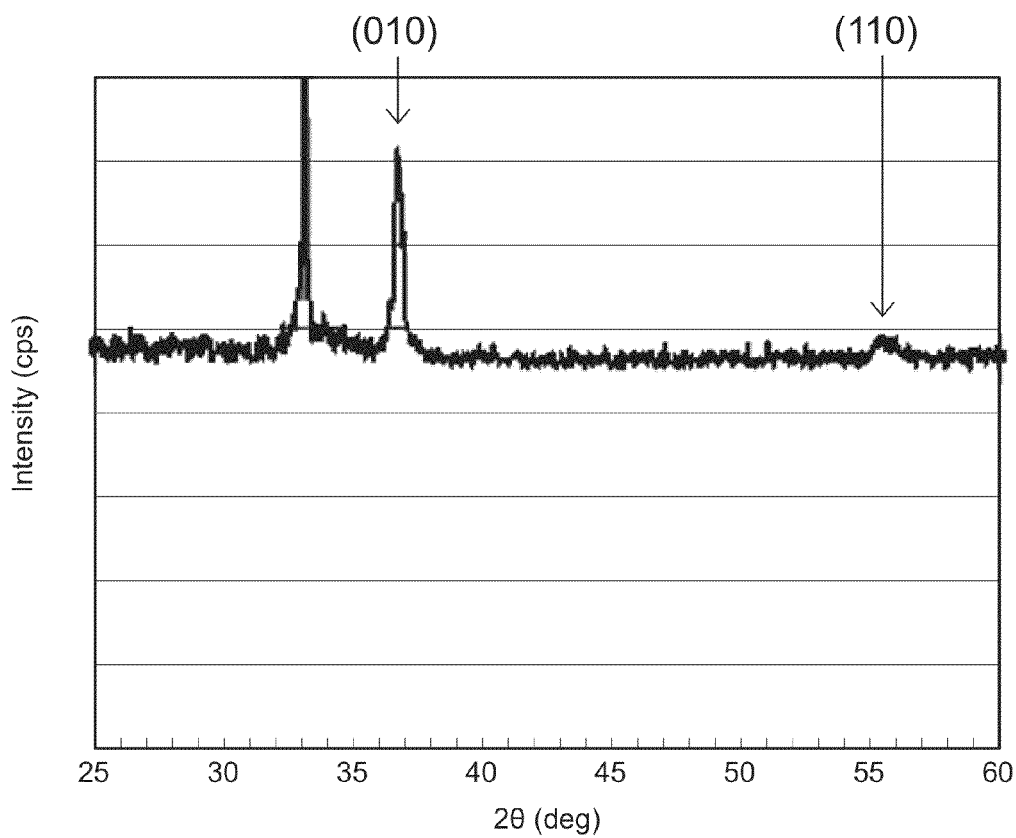
FIG. 3 is one example of a graph illustrating characteristics of the resistance change element according to the first embodiment.

FIG. 3 is one example of a graph illustrating characteristics of the resistance change element according to the first embodiment.

FIG. 3 shows an example of the analysis results of $NbO_x$ according to XRD; the horizontal axis is the angle 2θ in XRD analysis, and the vertical axis is the peak intensity (counts/second) of XRD. A sample in which a peak of XRD was observed was determined as the memory layer 15 being a crystal or having high crystallinity. A sample in which no peak was observed was determined as the memory layer 15 not being a crystal or having low crystallinity.

In FIG. 2, the case where the memory layer 15 is a crystal or the memory layer 15 has high crystallinity is expressed as "CR" for crystallinity CTY. The case where the memory layer 15 is not a crystal or the memory layer 15 has low crystallinity is expressed as "NC". In the case where the memory layer 15 is a crystal or has high crystallinity, the direction of the crystal plane having the maximum intensity was further investigated based on the diffraction angle 2θ of the observed peak. FIG. 2 shows the investigation results of the direction of the crystal plane CP of niobium oxide of the memory layer 15. The direction of the crystal plane will now be described.

In the example of FIG. 3, there is a peak at an angle 2θ of approximately 36.7 degrees, and the peak corresponds to the (010) plane. Furthermore, there is a peak at an angle 2θ of approximately 55.5 degrees, and the peak corresponds to the (110) plane. In FIG. 3, the peak at an angle 2θ of approximately 33 degrees corresponds to silicon used as the substrate.

In the XRD, a plane exhibiting the maximum peak out of the X-ray diffraction peaks for the memory layer 15 (niobium oxide) was found. That is, in this investigation, the peak of silicon used as the substrate (2θ being approximately 33 degrees) is excluded. For niobium oxide, the peak corresponding to the (010) plane (2θ being approximately 36.7 degrees) and the peak corresponding to the (110) plane (2θ being approximately 55.5 degrees) are observed. Of the two peaks, the peak corresponding to the (010) plane is higher than the peak corresponding to the (110) plane. In this case, the sample is regarded as the crystal plane of the (010) plane.

Thus, the direction of the peak with the maximum peak intensity out of the X-ray diffraction peaks for the memory layer 15 is regarded as the direction of the crystal plane of the memory layer 15.

The angle 2θ at which a peak is obtained in XRD includes errors in the measurement. For example, the measured angle 2θ includes an error of ±0.5 degrees. For example, in $Nb_2O_5$, when the angle 2θ of the XRD measurement is within a range of not less than 36.2 degrees and not more than 37.2 degrees, the crystal plane can be regarded as the (010) plane.

As shown in FIG. 2, in the first sample SP01, the second sample SP2, and the sixth sample SP6, the crystal plane CP is the (010) plane. In the third sample SP3, the crystal plane CP is the (100) plane. In the fourth sample SP4 and the fifth sample SP05, the crystal plane CP is the (110) plane. In the seventh sample SP07, the crystal plane CP is the (001) plane. In the eighth sample SP08, the crystal plane CP is (111).

Further, for the samples mentioned above, the distribution of the intensity of binding energy BE in the $3d_{5/2}$ orbital was analyzed by X-ray photoelectron spectroscopy (XPS). The binding energy BE is, for example, the potential energy necessary to separate an atomic nucleus and an electron. In this example, it is the energy necessary to separate the atomic nucleus of Nb and an electron in the $3d_{5/2}$ orbital, for example.

Figure 4:
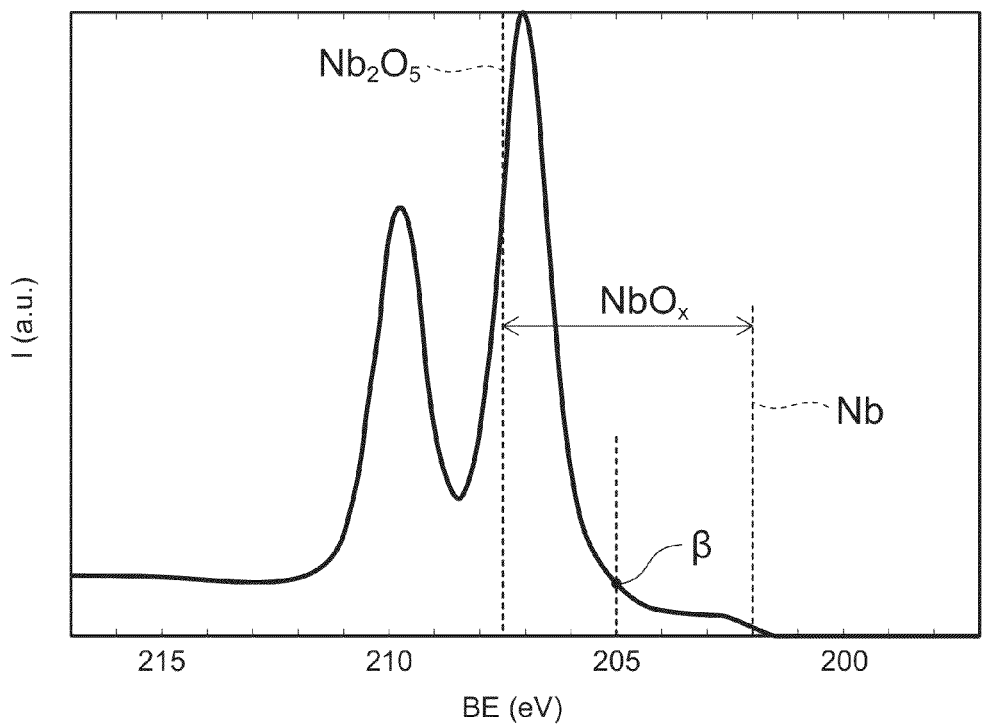
FIG. 4 is one example of a graph illustrating characteristics of the resistance change element according to the first embodiment.

FIG. 4 is one example of a graph illustrating characteristics of the resistance change element according to the first embodiment.

FIG. 4 shows an example of the analysis results of XPS of a sample. The horizontal axis of FIG. 4 is the binding energy BE (eV; electron volt) in XPS, and the vertical axis is the intensity I (arbitrary scale).

The peak of intensity for the $3d_{5/2}$ orbital of Nb appears at approximately 202.1 eV. The peak of intensity for the $3d_{5/2}$ orbital of Nb included in $Nb_2O_5$ appears at approximately 207.5 eV. The peak of intensity for the $3d_{5/2}$ orbital of Nb included in $NbO_x$ (0<x≤2.5) appears in a range of not less than 202.1 eV and not more than 207.5 eV.

In the evaluation of the first sample SP01 to the twelfth sample SP12, attention is focused on an intensity β of 205 eV, which is a middle value in the range mentioned above. As the evaluation parameter, the proportion γ of the intensity (second intensity) β at 205 eV of Nb included in $NbO_x$ to the intensity (first intensity) α at 207.5 eV of Nb included in $Nb_2O_5$ (γ=β/α) was found.

Further, the electrical characteristics were evaluated in the first sample SP01 to the twelfth sample SP12. In this evaluation, the initial resistance value immediately after the fabrication of the memory layer 15 was measured, then a voltage pulse (a voltage pulse corresponding to the reset operation or the set operation) was applied, and then the resistance value of the memory layer 15 was measured. When the resistance value of the memory layer 15 after the voltage pulse application was higher than the initial resistance value, the memory layer 15 was determined as being a "low resistance initial state." When the resistance value after the voltage pulse application was not more than the initial resistance value, the memory layer 15 was determined as being a "high resistance initial state."

In the case where the memory layer 15 exhibits the "high resistance initial state," forming processing is performed as described above in order to set the memory layer 15 to a usage state. On the other hand, in the case where the memory layer 15 exhibits the "low resistance initial state," forming processing can be omitted and the memory layer 15 can start to be used from the reset operation. In the case where the memory layer 15 exhibits the "low resistance initial state," the manufacturing of the resistance change element 110 can be made easier.

In FIG. 2, the "evaluation Ev" of the electrical characteristics is expressed by a "low resistance initial state LR" and a "high resistance initial state HR."

As shown in FIG. 2, the first sample SP01 to the eighth sample SP08 are crystals. On the other hand, the ninth sample SP09 to the twelfth sample SP12 are not crystals. In the first sample SP01 to the eighth sample SP08, the composition ratio x of oxygen is not less than 2.4 and not more than 2.5; and in the ninth sample SP09 to the twelfth sample SP12, the composition ratio x is not less than 0.8 and not more than 1.8. In $NbO_x$, the composition ratio x of oxygen is preferably more than 1.8 and not more than 2.5. In the embodiment, the memory layer 15 includes $NbO_x$ (1.8<x≤2.5). The composition ratio x is more preferably not less than 2.4 and not more than 2.5. The composition ratio x of oxygen in niobium oxide in the memory layer 15 can be analyzed with, for example, an ICP mass spectrometer (ICP-MS), Auger electron spectroscopy (AES), an energy dispersive X-ray spectrometer (EDX), or the like.

As shown in FIG. 2, of the first sample SP01 to the eighth sample SP08, which exhibited crystallinity, it is the first sample SP01 to the sixth sample SP06 that are the low resistance initial state LR. On the other hand, the seventh sample SP07 and the eighth sample SP08 are the high resistance initial state HR. In the first sample SP01 to the sixth sample SP06, the crystal plane CP determined as having the maximum intensity was three crystal planes CP expressed by Miller indices of (100), (010), and (110). On the other hand, in the seventh sample SP07 to the eighth sample SP08, the crystal plane CP determined as having the maximum intensity was crystal planes CP expressed by Miller indices of (001) and (111).

Thus, the low resistance initial state LR is obtained when one of the (100) plane, the (010) plane, and the (110) plane of the memory layer 15 is oriented in the stacking direction from the first conductive layer 10 toward the second conductive layer 20. Thereby, a resistance change element and a nonvolatile memory device that are more easily manufactured can be provided.

In the specification of this application, "the (100) plane of the memory layer 15 is oriented in the stacking direction from the first conductive layer 10 toward the second conductive layer 20" means that, when the memory layer 15 is measured by the X-ray diffraction method by causing X rays to be incident on the memory layer 15 from a direction at an angle θ from a direction parallel to the film surface of the memory layer 15 (incident angle: θ) and performing θ-2θ scanning, the peak intensity of the diffraction line of 100 reflection is greater than the peak intensities of the diffraction lines of the reflection of the other plane indices. This applies also to the (010) plane and the (110) plane. That is, when the peak intensity of the diffraction line of 010 reflection is greater than the peak intensities of the diffraction lines of the other plane indices when measured by the method described above, the (010) plane is oriented. Furthermore, when the peak intensity of the diffraction line of 110 reflection is greater than the peak intensities of the diffraction lines of the other plane indices when measured by the method described above, the (110) plane is oriented.

In other words, when the (100) plane of the memory layer 15 is oriented in the stacking direction from the first conductive layer 10 toward the second conductive layer 20, the intensity of 100 reflection in the X-ray diffraction method (diffractometer) for the memory layer 15 is higher than the intensities of the reflection of the other plane indices. Similarly, when the (010) plane of the memory layer 15 is oriented in the stacking direction from the first conductive layer 10 toward the second conductive layer 20, the intensity of 010 reflection in the X-ray diffraction method for the memory layer 15 is higher than the intensities of the reflection of the other plane indices. When the (110) plane of the memory layer 15 is oriented in the stacking direction from the first conductive layer 10 toward the second conductive layer 20, the intensity of 110 reflection in the X-ray diffraction method for the memory layer 15 is higher than the intensities of the reflection of the other plane indices.

That is, the low resistance initial state LR is obtained when, of the intensities of reflection of X-ray diffraction for the memory layer 15, the intensity of one of 100 reflection, 010 reflection, and 110 reflection is at a maximum.

FIG. 5A to FIG. 5F are examples of schematic views illustrating the configuration of the resistance change element.

The drawings illustrate relationships between crystal planes CF in the memory layer 15 and the major surface of the first conductive layer 10. The normal line to the major surface of the first conductive layer 10 (parallel to the stacking direction from the first conductive layer 10 toward the second conductive layer 20) is set substantially parallel to the c-axis of the memory layer 15. In the drawings, for the sake of simplicity, the crystal structure is shown in a model way using a cube.

FIG. 5A to FIG. 5F show a crystal plane CP(100), a crystal plane CP(010), a crystal plane CP(110), a crystal plane CP(001), a crystal plane CP(111), and a crystal plane CP(011), respectively.

Figure 5A:
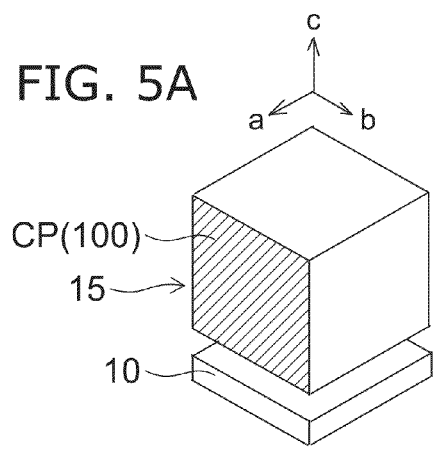
FIG. 5A to FIG. 5F are examples of schematic views illustrating the configuration of the resistance change element.
Figure 5B:
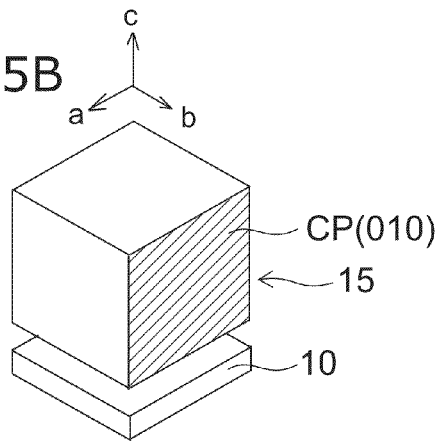
Figure 5C:
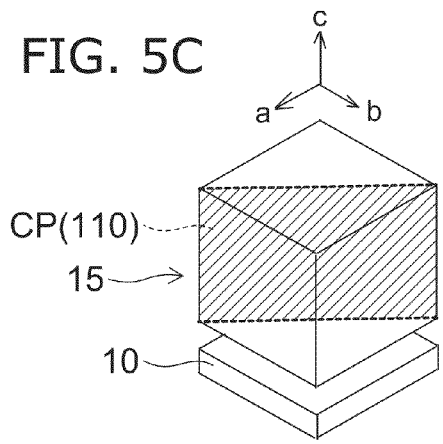
Figure 5D:
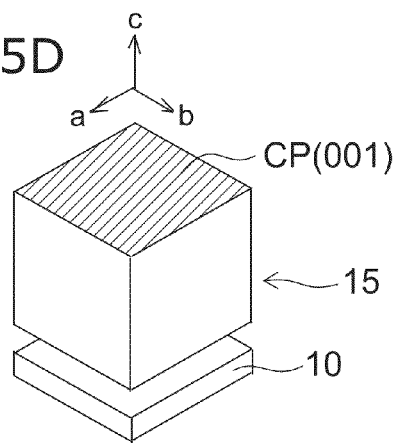
Figure 5E:
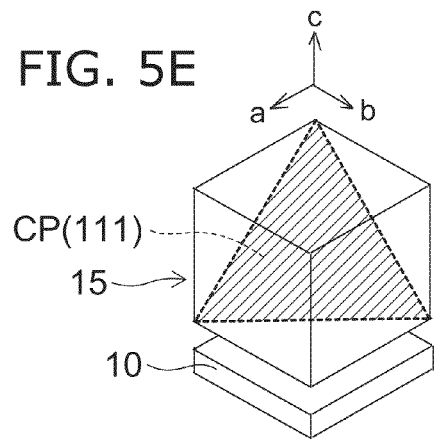
Figure 5F:
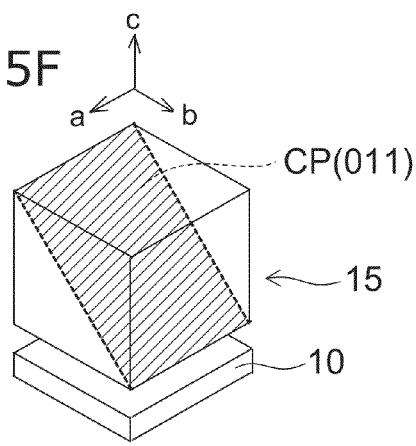

As shown in FIG. 5A to FIG. 5C, all of the crystal planes CP(100), CP(010), and CP(110) exhibiting the low resistance initial state LR are planes parallel to the c-axis. On the other hand, as shown in FIG. 5D and FIG. 5E, the crystal planes CP(001) and CP(111) corresponding to the high resistance initial state HR are planes nonparallel to the c-axis. As shown in FIG. 5F, also the crystal plane CP(011) is a plane nonparallel to the c-axis.

Figure 6:
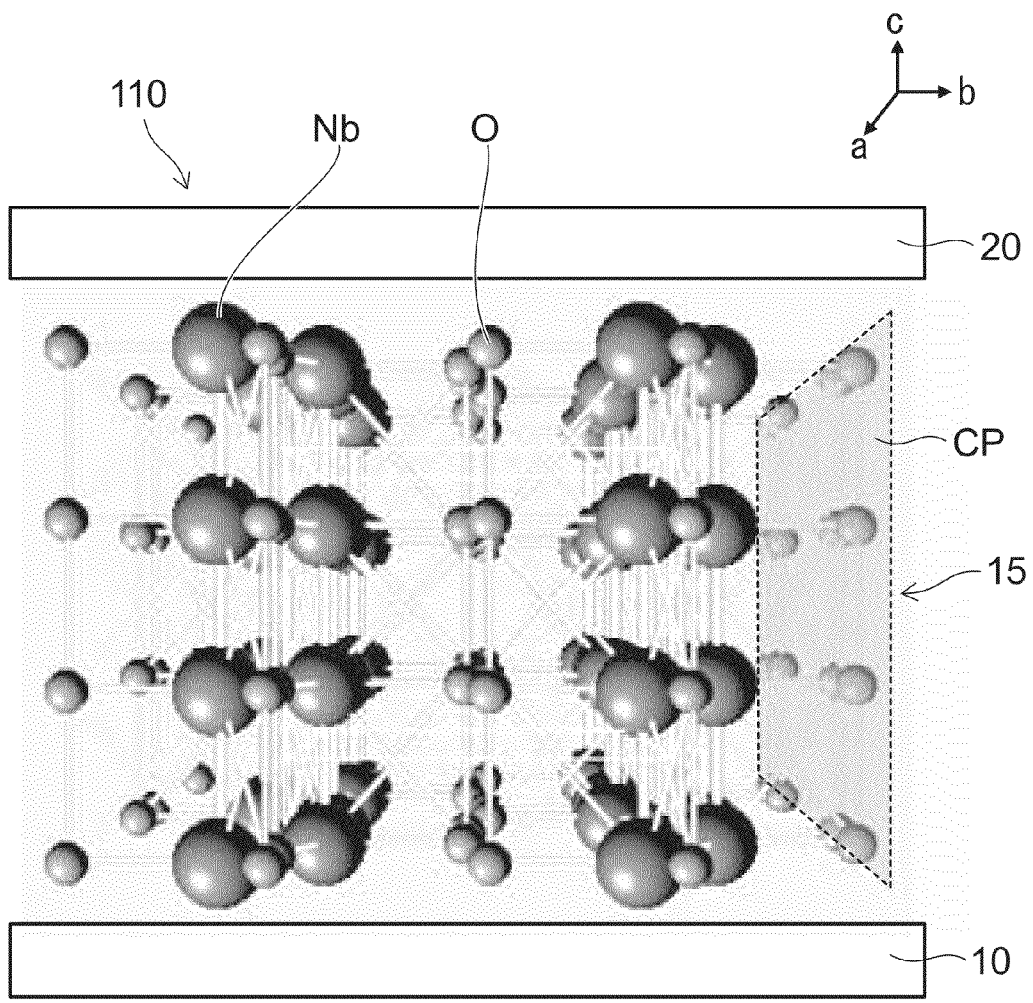
FIG. 6 is one example of a schematic view illustrating the configuration of the resistance change element according to the first embodiment.

FIG. 6 is one example of a schematic view illustrating the configuration of the resistance change element according to the first embodiment.

FIG. 6 shows a crystal structure of $NbO_x$ (a monoclinic crystal). In this example, the stacking direction from the first conductive layer 10 toward the second conductive layer 20 is taken as the c-axis. One direction perpendicular to the c-axis is taken as the a-axis. The direction perpendicular to the c-axis and the a-axis is taken as the b-axis. In this example, the memory layer 15 has a crystal plane CP expressed by the Miller indices (010).

As shown in FIG. 6, in the $NbO_x$, oxygen that forms anions is arranged on the crystal plane CP. The state in which the crystal plane CP(100), CP(010), or CP(110) has the maximum intensity in XRD corresponds to the state in which oxygen is arranged on a crystal plane CP parallel to the c-axis. It is presumed that in this state it becomes easy for oxygen to move in the stacking direction (the c-axis direction) from the first conductive layer 10 toward the second conductive layer 20. The fact that the low resistance initial state LR is obtained when the (100) plane, the (010) plane, or the (110) plane is oriented in the stacking direction from the first conductive layer 10 toward the second conductive layer 20 in XRD is presumed to relate to the ease of movement of oxygen (oxygen ions).

As shown in FIG. 2, in the first sample SP01 to the sixth sample SP06 of the low resistance initial state LR, the proportion γ of the intensity of binding energy is 0.062 or less. On the other hand, in the seventh sample SP07 to the twelfth sample SP12, which were not the low resistance initial state LR, γ is 0.063 or more.

As described above, the inventor of this application fabricated a plurality of samples in which niobium oxide was used as the material of the memory layer 15 and the composition ratio x of oxygen, the crystal orientation, etc. were changed. By measuring the characteristics of each of the plurality of samples, it has been found that the low resistance initial state LR is obtained when one of the (100) plane, the (010) plane, and the (110) plane of the memory layer 15 is oriented in the stacking direction from the first conductive layer 10 toward the second conductive layer 20. Furthermore, it has been found that the low resistance initial state LR is obtained when the γ mentioned above (the ratio of the intensity at a binding energy of 205 eV to the intensity at a binding energy of 207.5 eV in X-ray photoelectron spectroscopy for Nb included in the memory layer 15) is 0.062 or less. In such a situation, the device can start to be used from the reset operation, and forming processing after manufacturing is unnecessary. That is, the manufacturing of the resistance change element 110 can be made easier.

Second Embodiment

A nonvolatile memory device according to the embodiment has a cross-point configuration.

Figure 7:
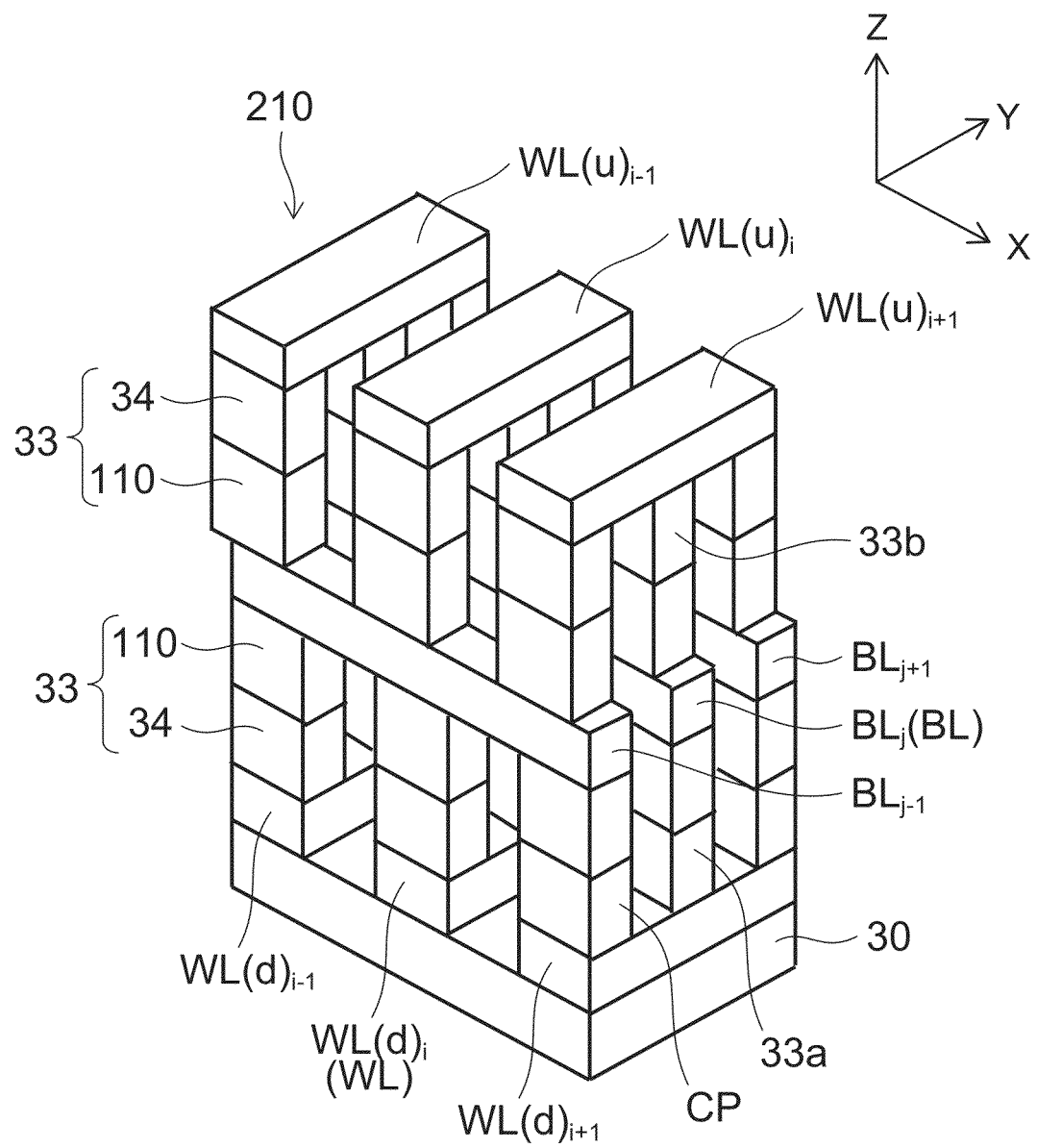
FIG. 7 is one example of a schematic perspective view illustrating the configuration of a nonvolatile memory device according to a second embodiment.

FIG. 7 is one example of a schematic perspective view illustrating the configuration of a nonvolatile memory device according to a second embodiment.

Figure 8:
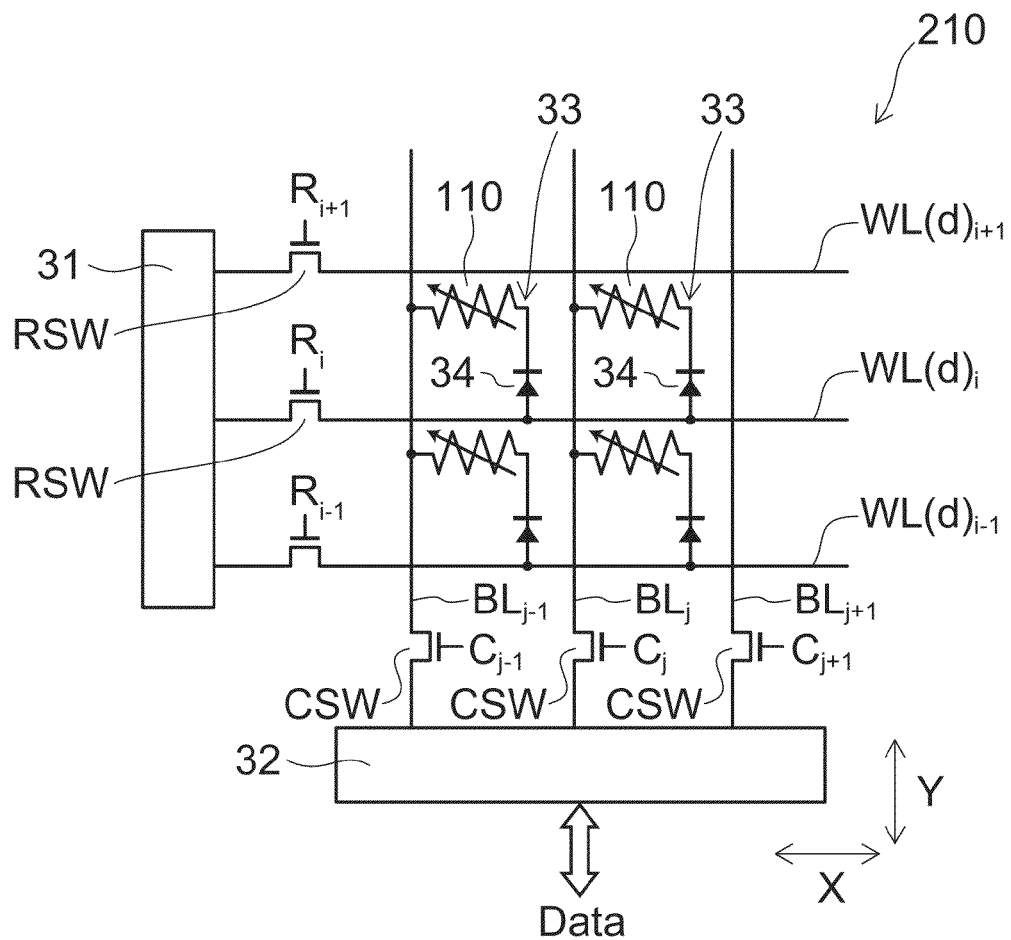
FIG. 8 is one example of a schematic diagram illustrating the configuration of the nonvolatile memory device according to the second embodiment.

FIG. 8 is one example of a schematic diagram illustrating the configuration of the nonvolatile memory device according to the second embodiment.

As shown in FIG. 7 and FIG. 8, a nonvolatile memory device 210 according to the embodiment includes a substrate 30. A plane parallel to the major surface of the substrate 30 is taken as the X-Y plane. One direction in the X-Y plane is taken as the X-axis direction. The direction perpendicular to the X-axis direction in the X-Y plane is taken as the Y-axis direction. The direction perpendicular to the X-axis direction and the Y-axis direction is taken as the Z-axis direction.

In the nonvolatile memory device 210, a plurality of first interconnections (word lines $WL(d)_{i-1}$, $WL(d)_i$, $WL(d)_{i+1}$, $WL(u)_{i-1}$, $WL(u)_i$, and $WL(u)_{i+1}$) with band shapes extending in the Y-axis direction (a first direction) are provided on the major surface of the substrate 30. The plurality of first interconnections are aligned in the X-axis direction. Furthermore, a plurality of second interconnections (bit lines $BL_{j-1}$, $BL_j$, and $BL_{j+1}$) with band shapes extending in the X-axis direction (a second direction) are provided. The plurality of second interconnections are aligned in the Y-axis direction. The second interconnections (the bit lines $BL_{j-1}$, $BL_j$, and $BL_{j+1}$) are opposed to the first interconnections (the word lines $WL(d)_{i-1}$, $WL(d)_i$, $WL(d)_{i-1}$ $WL(u)_{i-1}$, $WL(u)_i$, and $WL(u)_{i+1}$). In the following, the word lines $WL(d)_{i-1}$, $WL(d)_i$, $WL(d)_{i+1}$, $WL(u)_{i-1}$, $WL(u)_i$, and $WL(u)_{i+1}$ are collectively referred to as a word line WL. Furthermore, the bit lines $BL_{j-1}$, $BL_j$, and $BL_{j+1}$ are collectively referred to as a bit line BL.

Although in the above the extending direction of the first interconnection is orthogonal to the extending direction of the second interconnection, it is sufficient that the extending direction of the first interconnection intersect with (be nonparallel to) the extending direction of the second interconnection.

In the above, the subscript i and the subscript j are arbitrary integer number. That is, the number of first interconnections and the number of second interconnections are arbitrary.

In the specific example, the first interconnection forms the word line WL, and the second interconnection forms the bit line BL. However, the first interconnection may be the bit line BL, and the second interconnection may be the word line WL. In the following, a description is given on the assumption that the first interconnection is the word line WL and the second interconnection is the bit line BL.

A material resistant to heat and with a low resistant value is used for the word line WL and the bit line BL. For example, W, WSi, NiSi, CoSi, or the like is used for the word line WL and the bit line BL.

As shown in FIG. 7 and FIG. 8, a memory cell 33 is provided between the first interconnection and the second interconnection.

In the nonvolatile memory device 210, memory cells 33 of the first stage are provided on the word lines $WL(d)_{i-1}$, $WL(d)_i$, $WL(d)_{i+1}$ of the first stage. The bit lines $BL_{j-1}$, $BL_j$, and $BL_{j+1}$ are provided on the memory cells 33 of the first stage. Memory cells 33 of the second stage are provided on the bit lines $BL_{j-1}$, $BL_j$, and $BL_{j+1}$. The word lines $WL(u)_{i-1}$, $WL(u)_i$, and $WL(u)_{i+1}$ of the second stage are provided on the memory cells 33 of the second stage. For example, the word lines $WL(d)_{i+1}$ and $WL(u)_{i+1}$ (a plurality of first interconnections) are stacked along the Z-axis direction. The bit line $BL_j$ (one of the plurality of second interconnections) is disposed between the word lines $WL(d)_{i+1}$ and $WL(u)_{i+1}$ (nearest two first interconnections). One memory cell 33a out of the plurality of memory cells 33 is disposed between the word line $WL(d)_{i+1}$ and the bit line $BL_j$. Another memory cell 33b out of the plurality of memory cells 33 is disposed between the word line $WL(u)_{i+1}$ and the bit line $BL_j$. Thus, the nonvolatile memory device 210 has a three-dimensional structure in which memory cells 33 are stacked in two stages. Memory cells 33 may be stacked in three or more stages. Memory cells 33 may be provided in one stage.

As shown in FIG. 8, for example, one ends of the word lines $WL(d)_{i-1}$, $WL(d)_i$, and $WL(d)_{i+1}$ are electrically connected to a word line driver 31 having the decoder function via MOS transistors RSW that are select switches. One ends of the bit lines $BL_{j-1}$, $BL_j$, and $BL_{j+1}$ are electrically connected to a bit line driver 32 having the decoder and read functions via MOS transistors CSW that are select switches.

Select signals $R_{i-1}$, $R_i$, and $R_{i+1}$ for selecting word lines (rows) are inputted to the gates of the MOS transistors RSW, and select signals $C_{i-1}$, $C_i$, and $C_{i+1}$ for selecting bit lines (columns) are inputted to the gates of the MOS transistors CSW.

Memory cells 33 are arranged in intersection portions CP where the word lines $WL(d)_{i-1}$, $WL(d)_i$, and $WL(d)_{i+1}$ and the bit lines $BL_{j-1}$, $BL_j$, and $BL_{j+1}$ are opposed to each other. The nonvolatile memory device 210 includes a plurality of memory cells 33 arranged in the intersection portions CP of the word lines $WL_{i-1}$, $WL_i$, and $WL_{i+1}$ and the bit lines $BL_{j-1}$, $BL_j$, and $BL_{j+1}$.

Figure 9:
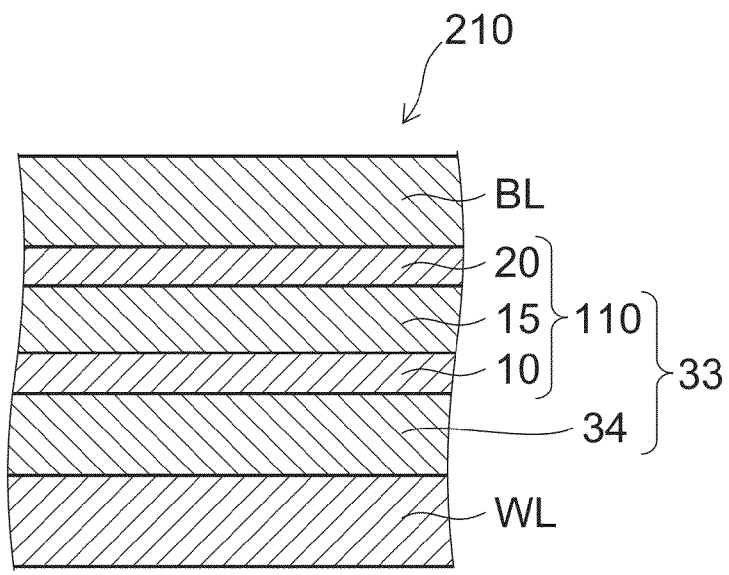
FIG. 9 is one example of a schematic cross-sectional view illustrating the configuration of a portion of the nonvolatile memory device according to the second embodiment.

FIG. 9 is one example of a schematic cross-sectional view illustrating the configuration of a portion of the nonvolatile memory device according to the second embodiment.

As shown in FIG. 9, the memory cell 33 can includes the resistance change element 110 and a rectifying element 34. The configuration described in regard to the first embodiment may be used for the resistance change element 110. The rectifying element 34 prevents a sneak current in writing/reading. The rectifying element 34 is a non-ohmic element.

The resistance change element 110 is, for example, provided on the bit line BL side. The rectifying element 34 is, for example, provided on the word line WL side. The first conductive layer 10 is provided between the memory layer 15 and the first interconnection. The second conductive layer 20 is provided between the memory layer 15 and the second interconnection. The rectifying element 34 is provided between the first conductive layer 10 and the first interconnection. Thereby, the word line WL, which is the first interconnection, is electrically connected to the first conductive layer 10 of the resistance change element 110 via the rectifying element 34. Furthermore, the bit line BL, which is the second interconnection, is electrically connected to the second conductive layer 20 of the resistance change element 110.

The bit line BL is shared between the memory cells 33 of the first stage and the memory cells 33 of the second stage. Therefore, the stacking order of the resistance change element 110 and the rectifying element 34 is opposite between the memory cell 33 of the first stage and the memory cell 33 of the second stage. In this case, also the stacking order of the first conductive layer 10, the second conductive layer 20, and the memory layer 15 is opposite between the memory cell 33 of the first stage and the memory cell 33 of the second stage. It is also possible to provide the resistance change element 110 on the word line WL side and provide the rectifying element 34 on the bit line BL side.

At least one of, for example, the word line WL, the rectifying element 34, and the bit line BL adjacent to the resistance change element 110 may be used as at least one of the first conductive layer 10 and the second conductive layer 20.

In the nonvolatile memory device 210 according to the embodiment, the word line driver 31 and the bit line driver 32 serving as a drive unit perform at least one of applying a voltage to the memory layer 15 and passing a current through the memory layer 15 via the word line WL and the bit line BL. Thereby, a change is produced in the memory layer 15 to write information. For example, the drive unit applies a voltage to the memory layer 15 to produce a change in the memory layer 15 to write information. Furthermore, written information can be read out. Furthermore, erasing can be performed.

Also in the nonvolatile memory device 210 according to the embodiment, the manufacturing can be made easier.

The embodiment provides a resistance change element and a nonvolatile memory device that are more easily manufactured.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiment of the invention is not limited to these specific examples. For example, one skilled in the art may appropriately select specific configurations of components of resistance change elements and nonvolatile memory devices such as first conductive layers, second conductive layers, and memory layers from known art and similarly practice the invention. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all resistance change elements and nonvolatile memory devices practicable by an appropriate design modification by one skilled in the art based on the resistance change elements and the nonvolatile memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A resistance change element comprising:
   a first conductive layer;
   a second conductive layer; and
   a memory layer provided between the first conductive layer and the second conductive layer and capable of reversibly transitioning between a first state and a second state due to at least one of a voltage and a current supplied via the first conductive layer and the second conductive layer, a resistance of the second state being higher than a resistance of the first state,
   wherein the memory layer includes niobium oxide, and one of a (100) plane, a (010) plane, and a (110) plane of the memory layer is oriented in a stacking direction from the first conductive layer toward the second conductive layer, and
   wherein a ratio of an intensity at a binding energy of 205 eV to an intensity at a binding energy of 207.5 eV of X-ray photoelectron spectroscopy of Nb included in the memory layer is 0.062 or less.

2. The resistance change element according to claim 1, wherein the binding energy is energy necessary to separate an atomic nucleus of Nb and an electron in a $3d_{5/2}$ orbital.

3. The resistance change element according to claim 1, wherein the memory layer includes $NbO_x$ ($1.8 < x \leq 2.5$).

4. The resistance change element according to claim 1, wherein the memory layer includes $NbO_x$ ($2.4 \leq x \leq 2.5$).

5. The resistance change element according to claim 1, wherein the first conductive layer and the second conductive layer include at least one of Pt, Au, Ag, Ru, RuN, Ir, Co, Ni, Ti, TiN, TaN, W, and Al.

6. The resistance change element according to claim 1, wherein
   the memory layer changes from the second state to the first state when a first voltage is applied between the first conductive layer and the second conductive layer,
   the memory layer changes from the first state to the second state when a second voltage is applied between the first conductive layer and the second conductive layer, and
   a polarity of the second voltage is opposite to a polarity of the first voltage.

7. The resistance change element according to claim 1, wherein
   a peak intensity of a diffraction line of 100 reflection measured by an X-ray diffraction method is greater than peak intensities of diffraction lines of reflection of other plane indices in the memory layer in which a (100) plane is oriented in the stacking direction,
   a peak intensity of a diffraction line of 010 reflection measured by an X-ray diffraction method is greater than peak intensities of diffraction lines of reflection of other plane indices in the memory layer in which a (010) plane is oriented in the stacking direction, and
   a peak intensity of a diffraction line of 110 reflection measured by an X-ray diffraction method is greater than peak intensities of diffraction lines of reflection of other plane indices in the memory layer in which a (110) plane is oriented in the stacking direction.

8. The resistance change element according to claim 1, wherein
   the memory layer includes a crystal and
   the stacking direction is parallel to a c-axis of the memory layer.

9. The resistance change element according to claim 8, wherein a crystal structure of the memory layer is a monoclinic crystal.

10. The resistance change element according to claim 9, wherein oxygen is arranged in a crystal plane of one of a (100) plane, a (010) plane, and a (110) plane of the memory layer.

11. The resistance change element according to claim 1, wherein a thickness of the memory layer is not less than 1 nm and not more than 30 nm.

12. A resistance change element comprising:
    a first conductive layer;
    a second conductive layer; and
    a memory layer provided between the first conductive layer and the second conductive layer and capable of reversibly transitioning between a first state and a second state due to at least one of a voltage and a current supplied via the first conductive layer and the second conductive layer, a resistance of the second state being higher than a resistance of the first state,
    the memory layer including niobium oxide, a ratio of an intensity at a binding energy of 205 eV to an intensity at a binding energy of 207.5 eV of X-ray photoelectron spectroscopy of Nb included in the memory layer being 0.062 or less.

13. A nonvolatile memory device comprising:
    a resistance change element including a first conductive layer, a second conductive layer, and a memory layer,
    the memory layer being provided between the first conductive layer and the second conductive layer,
    the memory layer being capable of reversibly transitioning between a first state and a second state due to at least one of a voltage and a current supplied via the first conductive layer and the second conductive layer, a resistance of the second state being higher than a resistance of the first state,
    the memory layer including niobium oxide, and one of a (100) plane, a (010) plane, and a (110) plane of the memory layer being oriented in a stacking direction from the first conductive layer toward the second conductive layer, and
    a ratio of an intensity at a binding energy of 205 eV to an intensity at a binding energy of 207.5 eV of X-ray photoelectron spectroscopy of Nb included in the memory layer is 0.062 or less;
    a first interconnection electrically connected to the first conductive layer; and
    a second interconnection electrically connected to the second conductive layer.

14. The device according to claim 13, wherein
the resistance change element, the first interconnection, and the second interconnection are provided in plural,
the first interconnections extend in a first direction perpendicular to the stacking direction and are aligned in a direction perpendicular to the stacking direction and the first direction,
the second interconnections extend in a second direction perpendicular to the stacking direction and nonparallel to the first direction and are aligned in a direction perpendicular to the stacking direction and the second direction, and
the resistance change elements are arranged in intersection portions of the first interconnections and the second interconnections.

15. The device according to claim 14, wherein the second direction is perpendicular to the first direction.

16. The device according to claim 14, wherein
the first interconnections are stacked along the stacking direction,
one of the second interconnections is disposed between nearest two of the first interconnections stacked in the stacking direction,
one of the resistance change elements is disposed between one of the nearest two first interconnections and the one of the second interconnection, and
another of the resistance change elements is disposed between another of the nearest two first interconnections and the one second interconnection.

17. The device according to claim 13, further comprising a rectifying element,
the first conductive layer being provided between the memory layer and the first interconnection,
the second conductive layer being provided between the memory layer and the second interconnection,
the rectifying element being provided between the first conductive layer and the first interconnection,
the first interconnection being electrically connected to the first conductive layer via the rectifying element.

18. The device according to claim 13, wherein the first interconnection and the second interconnection include at least one of W, WSi, NiSi, and CoSi.

19. The device according to claim 13, further comprising a drive unit electrically connected to the first interconnection and the second interconnection and configured to perform at least one of supplying a voltage to the memory layer and supplying a current to the memory layer via the first interconnection and the second interconnection.

* * * * *